(12) United States Patent
Yamasaki et al.

(10) Patent No.: US 7,282,419 B2
(45) Date of Patent: Oct. 16, 2007

(54) THIN-FILM CAPACITOR DEVICE, MOUNTING MODULE FOR THE SAME, AND METHOD FOR FABRICATING THE SAME

(75) Inventors: Tomoo Yamasaki, Nagano (JP); Kiyoshi Ooi, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 388 days.

(21) Appl. No.: 11/103,449

(22) Filed: Apr. 12, 2005

(65) Prior Publication Data

US 2005/0181573 A1    Aug. 18, 2005

Related U.S. Application Data

(62) Division of application No. 10/673,484, filed on Sep. 30, 2003, now Pat. No. 6,979,854.

(30) Foreign Application Priority Data

Oct. 4, 2002  (JP) .............................. 2002-292562

(51) Int. Cl.
   *H01L 21/20* (2006.01)
(52) U.S. Cl. ................ 438/381; 438/393; 438/396
(58) Field of Classification Search ................ 438/381, 438/393, 396, 240, 250, 253
   See application file for complete search history.

(56) References Cited

U.S. PATENT DOCUMENTS

| | | | |
|---|---|---|---|
| 6,370,012 B1 | 4/2002 | Adae-Amoakoh et al. | |
| 6,446,317 B1 | 9/2002 | Figueroa et al. | |
| 6,897,544 B2 * | 5/2005 | Ooi et al. | 257/532 |
| 6,998,308 B2 * | 2/2006 | Ooi et al. | 438/253 |
| 2002/0070400 A1 * | 6/2002 | Shibuya et al. | 257/296 |

FOREIGN PATENT DOCUMENTS

JP    2002-008942    1/2002

OTHER PUBLICATIONS

U.S. Appl. No. 10/673,484, filed Sep. 30, 2003, Tomoo Yamasaki, et al., Shinko Electric Industries Co., Ltd.

* cited by examiner

*Primary Examiner*—Michael Trinh
(74) *Attorney, Agent, or Firm*—Staas & Halsey LLP

(57) ABSTRACT

The invention is directed to a thin-film capacitor device that is adapted to be mounted on a printed wiring board together with an LSI device. After forming a plurality of grooves in a core substrate, a first conductive film is formed, and a first conductor is filled into each groove. After forming a metal film on the first conductive film, a dielectric film is generated by selective anodic oxidation of the metal film. A second conductive film is formed on the dielectric film, and an electrode connected to the second conductive film is formed. After removing the back surface of the core substrate until the grooves are exposed therein, an electrode for connection to the first conductor in each groove is formed. A capacitor is formed by the first conductive film and second conductive film sandwiching the dielectric film therebetween.

4 Claims, 5 Drawing Sheets

THIN-FILM CAPACITOR DEVICE, MOUNTING MODULE FOR THE SAME, AND METHOD FOR FABRICATING THE SAME

CROSS-REFERENCE TO RELATED APPLICATIONS

This application is a Divisional of application Ser. No. 10/673,484, now U.S. Pat. No. 6,979,854, filed Sep. 30, 2003 and claims the benefit of Japanese Patent Application No. 2002-292562, filed Oct. 4, 2002

BACKGROUND OF THE INVENTION

1. Field of the Invention

The present invention relates to a thin-film capacitor device, to be assembled into a semiconductor module, and to a method for fabricating the same. More particularly, the invention relates to a thin-film capacitor device which is a thin-film capacitor adapted to be mounted on a printed wiring board together with an LSI device, wherein provisions are made to suppress the generation of parasitic inductance and to reduce the size of the capacitor device by reducing the core substrate thickness, and the invention also relates to a mounting module and a fabrication method for the same.

2. Description of the Related Art

In recent years, in the field of digital LSI semiconductor devices used in electronic apparatuses, work has been proceeding toward reducing supply voltages for faster operating speeds and lower power consumption. In such an LSI, as the supply voltage for operating the LSI can become unstable due to rapid variations in impedance, etc., a bypass capacitor is placed between the voltage supply line of the LSI and the ground line to stabilize the supply voltage. Furthermore, stable operation in higher frequency (GHz) regions is demanded of high-speed digital LSIs and, to meet this demand, provisions are made to reduce high-frequency noise and prevent the LSIs from malfunctioning due to high-frequency noise.

Conventionally, a chip capacitor is used as the bypass capacitor, and this chip capacitor is mounted in close proximity to an LSI chip on a circuit board which is a motherboard. However, as wiring leads must be routed between the chip capacitor and the LSI chip, a relatively large inductance exists between these leads. As a result, even if the chip capacitor is provided, its effectiveness in suppressing variations in supply voltage and reducing high-frequency noise is substantially reduced in the case of a high-speed LSI.

The bypass capacitor is provided for reducing the equivalent series resistance and equivalent series inductance of substrate circuitry, but the increase in inductance due to the routing between the bypass capacitor and the LSI results in degrading the high-frequency characteristics of the bypass capacitor. To address this difficulty, a capacitor device designed so as to place the bypass capacitor directly below the LSI, thereby minimizing the wiring distance between the LSI and the bypass capacitor and thus reducing the inductance, is disclosed, for example, in Japanese Unexamined Patent Publication No. 2002-8942.

For example, in the case of a capacitor device constructed so as to minimize the wiring distance between the LSI and the capacitor and reduce the inductance by building the capacitor into the motherboard formed from a ceramic circuit substrate, there arise problems such as the following: the baking temperature of a high dielectric material for forming a capacitor insulating film, in the case of the ceramic circuit substrate, is as high as 700° C.; the fabrication process involves difficulty in stacking ferroelectric layers; there are limitations in improving the fabrication yield of the ceramic circuit substrate with a built-in capacitor; and there are limitations in the miniaturization process for forming through-holes in the ceramic circuit substrate at a reduced wiring pitch.

According to the prior art bypass capacitor device having the earlier described construction, the above-enumerated problems can be addressed, and a bypass capacitor device capable of being used with a high-speed digital LSI can be produced. Thus, the prior art has been able to provide a capacitor device that can reduce the required mounted area on the circuit substrate and yet has large capacitance for use in high frequency regions.

In the above-proposed capacitor device, however, a substrate formed from elemental silicon or from a silicon-containing insulating film or sapphire or the like, and having a thickness of 300 μm, is used as the core substrate that forms the base of the capacitor, and through-holes, into which conductive material is filled, are opened in the substrate in order to connect between the plurality of upper electrode pads on the LSI side and the plurality of lower electrode pads on the circuit substrate side. After the through-holes have been opened in the core substrate, the thickness of the core substrate determines the thickness of the capacitor device.

The operation of recent digital LSIs demands higher speed characteristics and, to meet this demand, the capacitor device must be further reduced in size and the characteristics of the package must be improved by reducing the wiring length between the capacitor device and the circuit substrate, as well as between the LSI and the capacitor device, thereby reducing parasitic inductance. There is therefore a need to further reduce the thickness of the core substrate forming the capacitor device; in particular, it is desired to reduce the thickness to 50 μm or less. However, in the prior art capacitor device, as the capacitor fabrication sequence requires that the through-holes be opened first, there arises the problem that there is a limit to further reducing the thickness of the core substrate in the fabrication process.

Furthermore, in the bypass capacitor according to the prior art capacitor device, the capacitor insulating film is formed by sputtering a high dielectric material, but the capacitor must be formed in a low-temperature process in order to prevent the deformation, etc. of the core substrate, due to the heat, during the processing.

The present invention has been devised in view of the above problem, and an object of the invention is to provide a thin-film capacitor device that can easily provide large capacitance, permits the use of a miniaturization process, and can reduce the required mounting area on the circuit substrate; it is also an object of the invention to provide a mounting module and a fabrication method for the same.

SUMMARY OF THE INVENTION

To solve the above problem, according to the present invention, there is provided a thin-film capacitor device, with a bypass capacitor formed on a surface of a core substrate, comprising: a lower electrode formed on the surface of the core substrate; a dielectric film generated from a metal film formed on the lower electrode; an upper electrode formed on the dielectric film; and a first conductor extending from the lower electrode toward an opposite surface of the core substrate, wherein a first electrode pad is provided on the first conductor and a second electrode pad is provided on a second conductor connected to the upper electrode.

The metal film is made of tantalum or titanium, and the dielectric film is generated by anodic oxidation of the tantalum or titanium; on the other hand, the first conductor is filled into a groove formed in the core substrate when forming the lower electrode thereon, and the opposite surface of the core substrate is formed by grinding the core substrate until the groove is exposed.

Further, by selective anodic oxidation, the metal film is divided into a dielectric film region and a first and a second metal film region; the first conductor connected to the lower electrode is connected to a lower surface of the first metal film region; a third conductor is connected to an upper surface of the first metal film region; the second conductor connected to the upper electrode is connected to an upper surface of the second metal film region; a fourth conductor is connected to a lower surface of the second metal film region; first to fourth electrode pads are provided on the first to fourth conductors, respectively; and a capacitor is formed by the dielectric film region, the upper electrode, and the lower electrode.

According to the present invention, there is also provided a thin-film capacitor device mounting module which contains the above-described thin-film capacitor device and a multilayer wiring circuit having external connection terminals, wherein the first electrode pad and the fourth electrode pad provided on the thin-film capacitor device are connected to the multilayer wiring circuit, and a semiconductor device is connected to the second electrode pad and the third electrode pad provided on the thin-film capacitor device; further, the module contains a plurality of the thin-film capacitor devices, and the first electrode pad and the fourth electrode pad provided on each of the thin-film capacitor devices are connected to the multilayer wiring circuit.

A thin-film capacitor fabrication method according to the present invention comprises the steps of: after forming a groove to a prescribed depth in a first surface of a core substrate, filling a first conductor into the groove while, at the same time, forming a first conductive film on the first surface; after forming a metal film on the first conductive film, generating a dielectric film by anodic oxidation of the metal film; forming a second conductive film on the dielectric film, and forming a first electrode connected to the second conductive film; and after removing a second surface portion from an opposite surface of the core substrate, forming a second electrode for connection to the first conductor in the groove.

The fabrication method further includes the steps of: after forming a first groove and a second groove spaced apart from each other in the first surface, filling the first conductor into the first and second grooves while, at the same time, forming the first conductive film on the first surface; generating the dielectric film in a portion of the metal film which corresponds to a portion where neither the first groove nor the second groove is formed; separating the first conductive film formed on the first and second grooves by an insulator; after removing a portion of the second conductive film on the metal film which corresponds to a portion where the first groove is formed, forming on the metal film a third electrode insulated from the second conductive film; and forming a fourth electrode which is connected to the first conductive film filled into the second groove and is insulated from the second electrode.

In the above fabrication method, the metal film is made of tantalum or titanium, and the dielectric film is generated by anodic oxidation of the tantalum or titanium.

BRIEF DESCRIPTION OF THE DRAWINGS

The above object and feature of the present invention will be more apparent from the following description of the preferred embodiments with reference to the accompanying drawings, wherein.

DESCRIPTION OF THE PREFERRED EMBODIMENTS

For a better understanding of the effect offered by the present invention, first a description will be given of the structure of a conventional thin-film capacitor device, which is adapted to be mounted on a printed wiring board together with an LSI chip, and to which the present invention is not applied.

Figure 5:
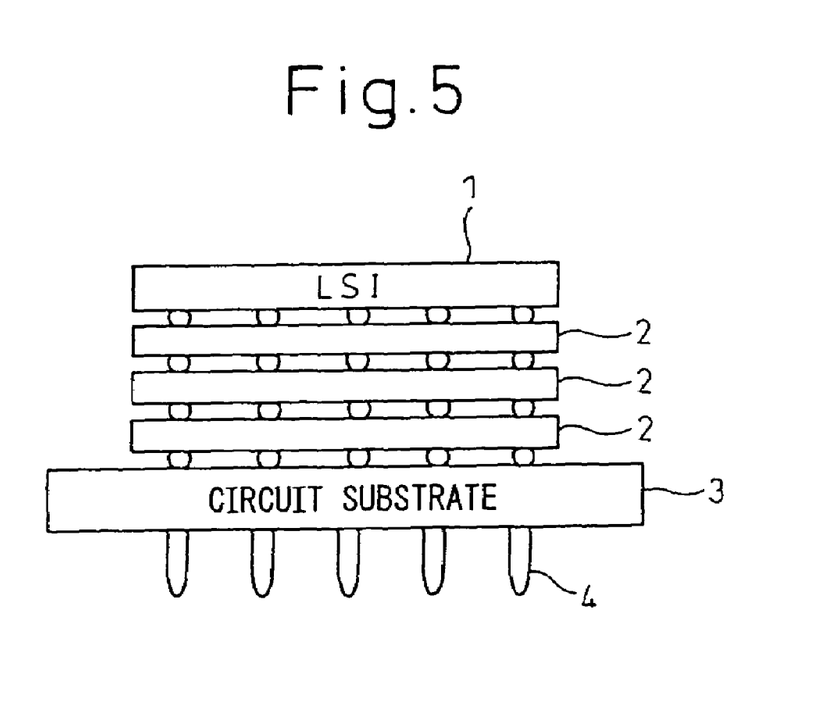
FIG. 5 is a diagram for explaining the condition in which a prior art capacitor device is mounted on a printed circuit board together with an LSI chip.

FIG. 5 is a simplified schematic showing the construction of the above-proposed thin-film capacitor device mounted on the printed wiring board. A plurality of capacitor devices 2, each containing a bypass capacitor, are mounted, one on top of another, between the LSI 1 and the circuit substrate 3, the stacked capacitor devices acting as one capacitor device corresponding to one LSI. By stacking the capacitor devices 2 in this manner, the capacitance of the bypass capacitor as a whole is increased without increasing the mounting area. In FIG. 5, only one LSI 1 is shown, but actually, a plurality of LSIs 1 are mounted on the upper surface of the circuit substrate 3; depending on the design, LSIs are also mounted on the lower surface of the substrate. In multichip module mounting, the above construction serves to reduce parasitic inductance, to stabilize operation of the LSI 1 in high frequency regions, and to achieve high-speed circuit operation.

Figure 6:
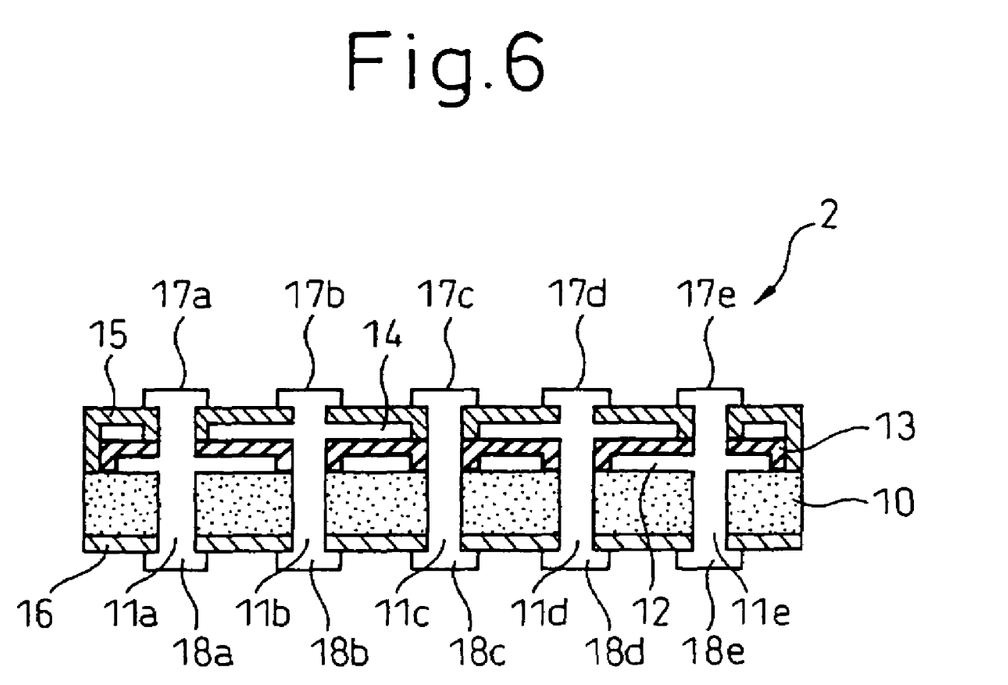
FIG. 6 is a cross-sectional view for explaining the structure of the prior art capacitor device.

FIG. 6 is a schematic cross-sectional view showing the internal structure of the bypass capacitor contained in each capacitor device 2 shown in FIG. 5.

To describe the fabrication sequence for the bypass capacitor 2, a substrate 10 is formed from elemental silicon or from a silicon-containing insulating film or a sapphire, through-holes 11a to 11e are formed in the substrate 10, and a conductor is filled into each through-hole while forming a conductive film 12 over the upper surface of the substrate 10. After forming lower electrodes by patterning the conductive film 12, a capacitor insulating film 13 of a dielectric material is formed over the lower electrodes. Then, a conductive film 14 for forming upper electrodes is deposited on top of the capacitor insulating film 13. Further, insulating films 15 and 16 are formed over the upper and lower surfaces, respectively, and upper electrode pads 17a to 17e and lower electrode pads 18a to 18e are formed, to complete the fabrication of the bypass capacitor 2.

In the bypass capacitor 2 shown in FIG. 6, the upper electrode pads 17a and 17e are connected to power supply lines of the LSI 1, the upper electrode pads 17b and 17d are connected to the ground (GND) line of the LSI 1, and the upper electrode pad 17c is connected to a signal line. On the other hand, the lower electrode pads 18a and 18e are connected to power supply lines of the circuit substrate 3, the lower electrode pads 18b and 18d are connected to the ground (GND) line of the circuit substrate 3, and the lower electrode pad 18c is connected to a signal line of the circuit substrate 3.

In the fabrication of the bypass capacitor, the through-holes are formed passing through the substrate 10 from the upper surface to the lower surface thereof; here, fine through-holes can be formed by dry etching or by a processing technique using laser. The conductor 12 is filled into each through-hole opened in the substrate 10, and the lower electrodes 12, the capacitor insulating film 13, and the upper electrodes 14 are formed in this order on the substrate to form the capacitor. In this way, a capacitor device having a small mounting area can be fabricated.

Further, at least one intermediate electrode is formed within the capacitor insulating film 13 in such a manner as to oppose the upper electrodes 14 and the lower electrodes 12. When this intermediate electrode is in an electrically floating state, a plurality of capacitors are formed in series between the upper electrodes 14 and the lower electrodes 12. Accordingly, even if the electrodes of some of the series-connected capacitors become shorted together, the capacitor device itself is not rendered defective since those some of the capacitors retain the functions of capacitors. The fabrication yield and reliability of the capacitor device can thus be improved.

In this way, as the capacitors comprising the upper electrodes 14, dielectric film 13, and lower electrodes 12 can be connected in parallel, a capacitor device having large capacitance can be easily fabricated. Further, the LSI as a semiconductor device and the capacitor device can be constructed into a module by stacking them one on top of the other on the circuit substrate as the motherboard and connecting them together. That is, when connection electrodes of the LSI are formed at positions corresponding to the connection electrodes provided on the upper surface of the capacitor device, and connection electrodes of the circuit substrate are formed at positions corresponding to the connection electrodes provided on the lower surface of the capacitor device, the LSI and the capacitor device can be stacked one on top of the other on the circuit substrate by aligning their connection electrodes with each other.

The LSI and the capacitor device, and the capacitor device and the circuit substrate, can thus be connected each other vertically in the shortest distance; as the wiring distance from the capacitor device to the semiconductor device as well as to the circuit substrate can be reduce in this way, inductance associated with circuit wiring can be reduced, which improves the performance of circuit operation in high-frequency regions.

In the prior art capacitor device described above, to electrically connect between the upper surface and the lower surface of the core substrate that forms the base of the capacitor device, the through-holes which can be filled with conductive material are opened through the core substrate at the initial stage of the fabrication process. From the standpoint of reducing the parasitic inductance on the wiring, the thickness of the core substrate should be made as small as possible; however, for reasons of productivity, including ease of handling in various processes applied to the core substrate, there is a limit to reducing the thickness, and it has not been possible to provide for LSI operation in higher frequency regions.

In view of this, in a thin-film capacitor device according to the embodiment described hereinafter, a plurality of grooves are formed in the core substrate, the conductor for forming the lower electrodes is filled therein, and the bypass capacitors are formed on the core substrate, after which the back surface of the core substrate, opposite to the surface on which the capacitors are formed, is removed by grinding it until the conductor is exposed. The lower electrode pads are formed on the thus exposed conductor portions. Since there is no need to open the holes passing through the core substrate from the upper to the lower surface thereof, the thickness of the core substrate can be further reduced.

Further, in the prior art capacitor device, the capacitor insulating film is formed by sputtering an oxide metal of a high dielectric constant; on the other hand, in the thin-film capacitor device of the present embodiment, the capacitor insulating film is formed by first producing a valve metal film and then performing selective anodic oxidation, to allow the use of not only a substrate made of elemental silicon or silicon-containing insulating film or a sapphire but also a substrate made of organic material as the core substrate, and to allow the substrate to be processed by a lower temperature process and reduce the deformation of the core substrate due to heat. In the prior art capacitor device, as the capacitor insulating film is sputtered after patterning the lower electrodes, the planarity of the upper electrodes is impaired, but in the thin-film capacitor device of the present embodiment which employs the above-described production method, the high dielectric film is selectively generated after forming the valve metal film on top of the conductive film formed over the surface of the core substrate; this not only serves to planarize the capacitors, but can reduce the thickness of the capacitors formed on the core substrate.

Figure 1:
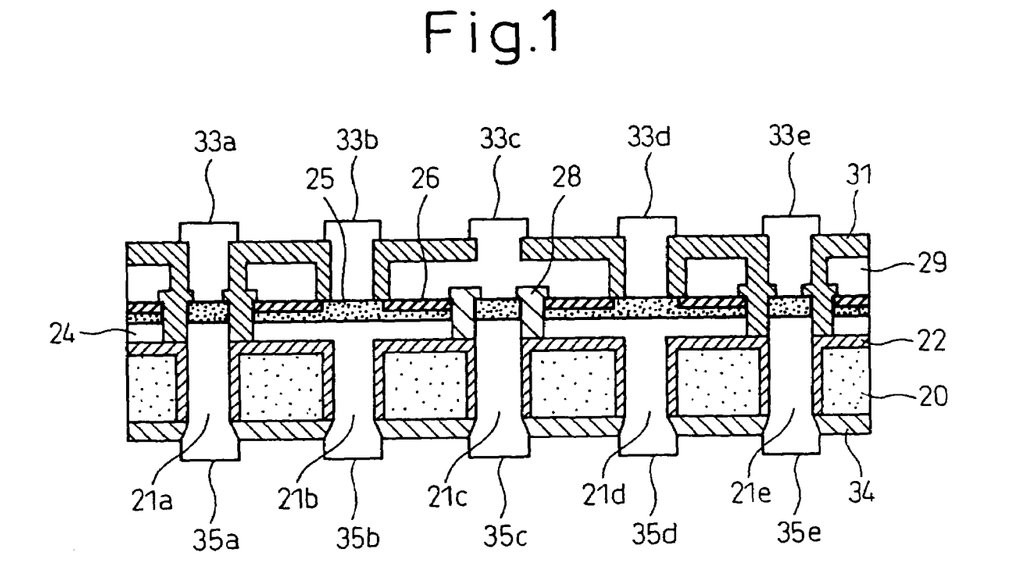
FIG. 1 is a cross-sectional view for explaining the structure of a thin-film capacitor according to an embodiment of the present invention.

The structure of the thin-film capacitor device according to the present embodiment is shown in FIG. 1. FIG. 1 shows a cross section of the capacitor device; here, the film thickness, electrode size, etc. are shown schematically and partially exaggerated for illustrative purposes. The upper electrode pads 33a and 33e are connected to power supply lines of the LSI 1, the upper electrode pads 33b and 33d are connected to the ground (GND) line or power supply lines of the LSI 1, and the upper electrode pad 33c is connected to a power supply line or GND line, while the lower electrode pads 35a and 35e are connected to signal lines of the circuit substrate 3, the lower electrode pads 35b and 35d are connected to the ground (GND) line or power supply lines of the circuit substrate 3, and the lower electrode pad 35c is connected to a power supply line or GND line of the circuit substrate 3.

In the example of the thin-film capacitor device shown in FIG. 1, elemental silicon is used for the core substrate 20, and a first insulating film 22 is formed to insulate conductors, such as the lower electrodes, from the core substrate 20. If the core substrate 20 is formed from an insulating material such as an organic material, the first insulating film 22 is not needed.

A first conductor 24 for forming the lower electrodes and a metal film 25 made of a valve metal, for example, tantalum, are formed on top of the first insulating film 22. In the metal film 25, high dielectric films 26 are formed by anodic oxidation only in regions where capacitors are to be formed. With the formation of a third insulating film 28, the metal film 25 and the first conductor 22 are divided into a plurality of portions, resulting in the formation of a plurality of lower electrodes. A second conductor 29 is formed on the metal film 25, to form the upper electrodes each insulated by a fourth insulating film 31. A third conductor 33 is deposited to form the upper electrode pads 33a to 33e.

A fifth insulating film 34 is formed on the lower surface of the core substrate 20, and the lower electrode pads 35a to 35e are attached to the first conductor 24 filled into the first grooves 21a to 21e. Regions of the metal film 25 other than the anodically oxidized regions thereof serve as electrical signal current paths between the upper electrode pads 33a to 33e and their corresponding lower electrode pads 35a to 35e, because the upper surface of these regions is in contact with the second conductor 29 and the lower surface is in contact with the first conductor 24. The third insulating film 28 also has the function of electrically isolating the metal film 25.

As described above, in the thin-film capacitor device of the present embodiment, bypass capacitors are formed on the upper surface of the core substrate 20 by sandwiching the high dielectric films 26 between the lower electrodes of the first conductor 24 and the upper electrodes of the second conductor 29.

Next, the fabrication sequence for the thin-film capacitor device of the present embodiment having the structure shown in FIG. 1 will be described with reference to FIGS. 2 and 3. In the example of the fabrication sequence illustrated here, the core substrate is formed from elemental silicon.

Figure 2A:
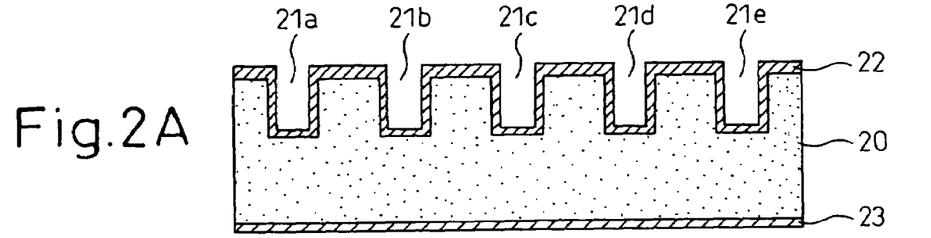
FIGS. 2A to 2D are cross-sectional views for explaining step by step the fabrication method for the thin-film capacitor according to the embodiment.

First, the first grooves 21a to 21e with depths for connection to the lower electrode pads 35a to 35e are formed by etching or like technique in one surface of the core substrate 20 which has a thickness greater than the thickness of the final substrate on which the bypass capacitors are to be formed. Then, the first insulating film 22 of silicon oxide is formed, for example, by thermal oxidation, over the entire surface of the core substrate 20 including the inner circumferential surfaces of the first grooves. A second insulating film 23 is formed on the lower surface of the core substrate 20. The second insulating film 23 functions as a protective film in a subsequent processing step. The resulting structure is shown in FIG. 2A.

Next, the first conductive film 24 is formed over the first insulating film 22, for example, by copper plating or the like; here, the first conductor 24 is also filled into the first grooves 21a to 21e, and the surface of the first conductive film 24 is planarized by controlling the thickness of the first conductive film 24 to a prescribed thickness. Then, the metal film 25 of a prescribed thickness is formed by sputtering on the first conductive film 24. In the illustrated example, tantalum Ta is used as the material of the metal film 25, after considering the capacitor characteristics. Other materials such as titanium Ti or silicon oxide may be used as long as the material can be used to form high dielectric films by low-temperature anodic oxidation.

Figure 2B:
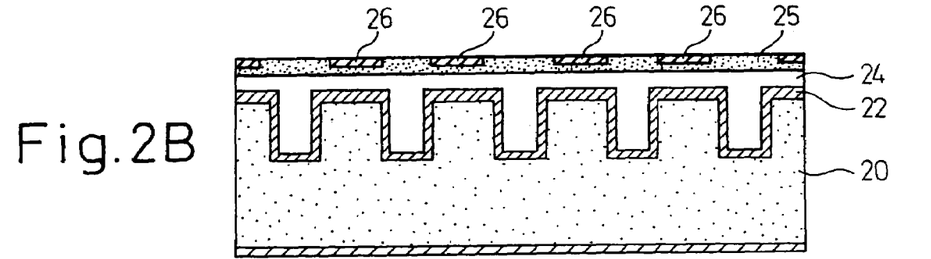

After that, the surface portions of the metal film 25 that correspond to the first grooves 21a to 21e are covered with a mask or the like, and those regions of the metal film 25 that are not masked are anodically oxidized. With this masking, the metal film 25, when viewed from the top, is divided between high dielectric film regions and metal film regions. The anodic oxidation here is performed by a conventional method at about 100° C., and the tantalum Ta is selectively oxidized on the surface of the metal film 25 to form the high dielectric films 26 of tantalum oxide. The thickness of each high dielectric film 26 can be adjusted in the thickness direction of the metal film 25. The high dielectric film 26 may be formed through the entire thickness of the metal film 25 or only in the surface portion of the metal film 25, whichever method is used according to the desired capacitance of the bypass capacitor. The surface planarity of the metal film 25 is maintained after the high dielectric films 26 are selectively generated. The structure up to this fabrication step is shown in FIG. 2B.

Figure 2C:
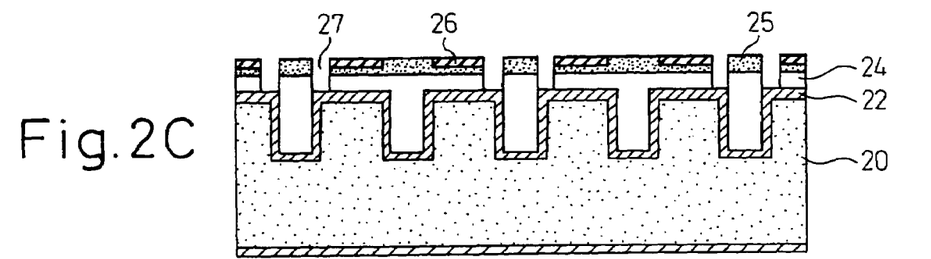

Thereafter, the first conductive film 24 and the metal film 25 are together patterned by etching or the like, as shown in FIG. 2C. With this patterning, a plurality of second grooves 27 are formed, to form the lower electrodes one spaced apart from another. Therefore, the second grooves 27 are formed to a depth reaching the upper surface of the first insulating film 22.

Figure 2D:
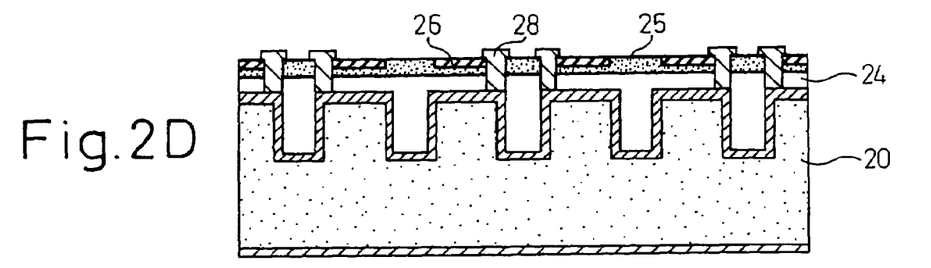

Next, the third insulating film 28 is formed for the plurality of second grooves 27 thus patterned. The third insulating film 28 is formed to insulate the respective lower electrodes from each other. The third insulating film 28 is patterned, leaving its head portions that are not large enough to impair the surface planarity of the metal film 25. The resulting structure is shown in FIG. 2D.

Figure 3A:
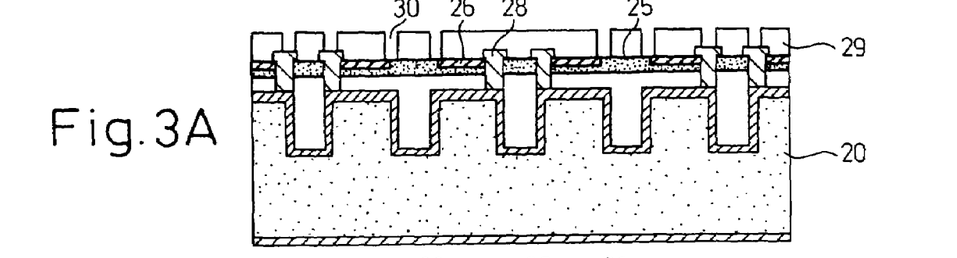
FIGS. 3A to 3D are cross-sectional views for explaining step by step the fabrication method continuing from FIGS. 2A to 2D.

In this condition, the second conductive film 29 is formed over the metal film 25 by sputtering or plating copper or a like material. Then, a plurality of third grooves 30 are formed by patterning the second conductive film 29 so that the regions thereof corresponding to the regions where the high dielectric films 26 are generated will become the upper electrodes. The resulting structure is shown in FIG. 3A.

Figure 3B:
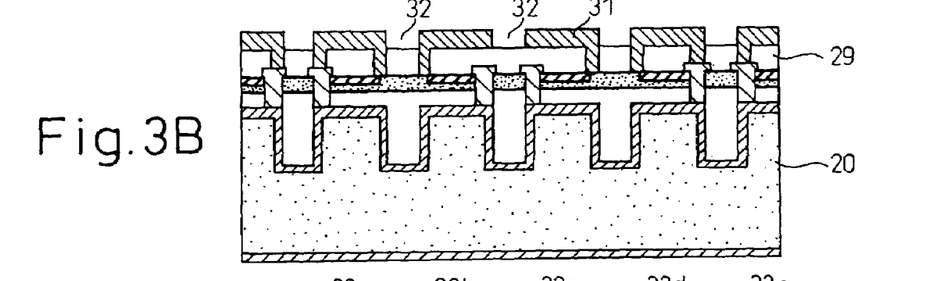

Subsequently, the fourth insulating film 31 is formed in such a manner as to cover the second conductive film 29 while also filling into the plurality of grooves 30. Then, only the portions of the fourth insulating film 31 that correspond to the positions of the first grooves 21a to 21e are removed by etching or the like, to form a plurality of fourth grooves 32. The resulting structure is shown in FIG. 3B.

Figure 3C:
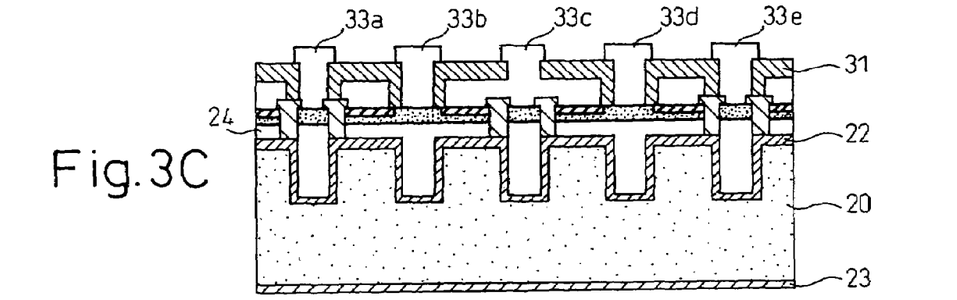

Next, as shown in FIG. 3C, the third conductive film 33 is formed on the fourth insulating film 31 by plating copper or like material. The third conductive film 33 thus formed is patterned to form the upper electrode pads 33a to 33e.

Figure 3D:
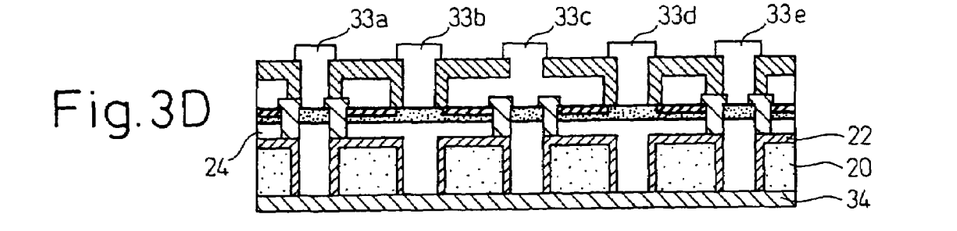

Then, the second insulating film 23 is removed from the lower surface of the core substrate 20 opposite to the surface on which the capacitors are formed, and the core substrate 20 is ground until the first conductor 24 filled into the first grooves 21a to 21e is exposed. When the first conductor 24 is exposed, the fifth insulating film 34 is formed over the entire surface. The resulting structure is shown in FIG. 3D.

Further, the fifth insulating film 34 is removed from the areas where the first conductor 24 is located, and a fourth conductor 35 is formed by copper plating or the like. Then, the fourth conductor 35 is patterned to form the lower electrode pads 35a to 35e. This completes the fabrication of the thin-film capacitor device with the bypass capacitors formed on a single elemental silicon core substrate as shown in FIG. 1.

Figure 4:
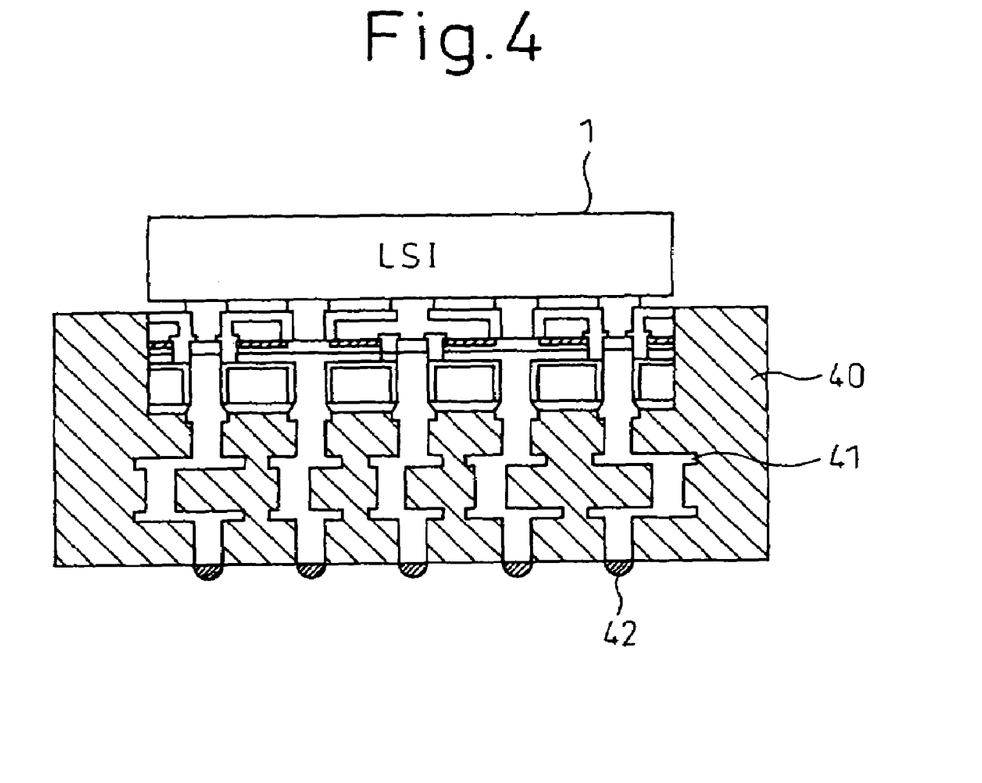
FIG. 4 is a diagram for explaining the condition in which the thin-film capacitor device of the embodiment is constructed as a module and assembled in a circuit substrate.

The structure of the thin-film capacitor device of the present embodiment and the fabrication sequence for the same have been described above. FIG. 4 shows a specific embodiment in which the thin-film capacitor device of the present embodiment is actually mounted directly below an LSI chip as shown in FIG. 5.

In the specific example shown in FIG. 4, the thin-film capacitor device of the present embodiment shown in FIG. 1 is embedded within a module 40. FIG. 4 shows the details of one thin-film capacitor device. The thin-film capacitor device is embedded with its upper electrode pads 33*a* to 33*e* exposed in the upper surface of the module 40. The lower electrode pads 35*a* to 35*e* of the thin-film capacitor device are connected to a multilayer wiring structure 41 built into the module 40. On the lower surface of the module 40 are formed connection terminals 42 which are connected to the multilayer wiring structure 41 and serve the same purpose as the I/O pins 4 shown in FIG. 5.

The multilayer wiring structure 41 provided within the module 40 corresponds to the wiring lines formed on the circuit substrate 3 in the example of FIG. 5, and the module 40 serves the purpose as the circuit substrate. To the upper electrode pads 33*a* to 33*e* arranged in the upper surface of the module 40 are connected the corresponding electrodes of the LSI. A plurality of such thin-film capacitor devices are embedded within the module 40, and one LSI chip can be mounted on each of the thin-film capacitor devices.

By modularizing the thin-film capacitor device and the multilayer wiring structure in integral fashion as described above, the wiring lines can be made as short as possible and, as a result, parasitic inductance due to wiring can be reduced. In addition, the package size can be further reduced.

As described above, according to the thin-film capacitor device of the present invention, the plurality of grooves are formed in the core substrate, the conductor for forming the lower electrodes is filled therein, and the bypass capacitors are formed on the core substrate, after which the back surface of the core substrate, opposite to the surface on which the capacitors are formed, is removed by grinding it until the conductor is exposed, and the lower electrode pads are formed on the thus exposed conductor portions. Accordingly, as there is no need to open the holes passing through the core substrate from the upper to the lower surface thereof, the thickness of the core substrate of the final thin-film capacitor device can be further reduced, and thus the thin-film capacitor device can be made smaller. As a result, the conductor length can be made shorter to reduce parasitic inductance.

Besides, as the thickness of the core substrate of the thin-film capacitor device is reduced at the final stage of the process, handling of the substrate is facilitated, and productivity improves.

Further, since the high dielectric films for forming the thin-film capacitors are generated by anodic oxidation of a metal film made of tantalum or titanium, the high dielectric films can be made thinner, making it possible to form large-capacitance capacitors and, as a result, the thin-film capacitor device can be made smaller. Here, as the capacitors can be formed using a low-temperature process, deformation of the core substrate can be prevented.

Furthermore, according to the fabrication sequence, the first conductor, the metal film, and the second conductor are formed sequentially one on top of another; this ensures the planarity of the capacitors formed, and contributes to reducing the thickness of the thin-film capacitor portion.

When the thin-film capacitor device of the present invention is packaged into a module together with a multilayer wiring structure, and the module is mounted directly below an LSI chip, the bypass capacitors are located in close proximity to the electrodes; this serves to enhance the stability of the supply voltage to the LSI, and improve the characteristics of the package.

What is claimed is:

1. A thin-film capacitor fabrication method comprising the steps of:

after forming a groove to a prescribed depth in a first surface of a core substrate, filling a first conductor into said groove while, at the same time, forming a first conductive film on said first surface;

after forming a metal film on said first conductive film, generating a dielectric film by anodic oxidation of said metal film;

forming a second conductive film on said dielectric film, and forming a first electrode connected to said second conductive film; and after removing a second surface portion from an opposite surface of said core substrate, forming a second electrode for connection to said first conductor in said groove.

2. A thin-film capacitor fabrication method as claimed in claim 1, wherein said metal film is made of tantalum or titanium, and said dielectric film is generated by anodic oxidation of said tantalum or titanium.

3. A thin-film capacitor fabrication method as claimed in claim 1, including the steps of:

after forming a first groove and a second groove spaced apart from each other in said first surface, filling said first conductor into said first and second grooves while, at the same time, forming said first conductive film on said first surface;

generating said dielectric film in a portion of said metal film which corresponds to a portion where neither said first groove nor said second groove is formed;

separating said first conductive film formed on said first and second grooves by an insulator;

after removing a portion of said second conductive film on said metal film which corresponds to a portion where said first groove is formed, forming on said metal film a third electrode insulated from said second conductive film; and forming a fourth electrode which is connected to said first conductive film filled into said second groove and is insulated from said second electrode.

4. A thin-film capacitor fabrication method as claimed in claim 3, wherein said metal film is made of tantalum or titanium, and said dielectric film is generated by anodic oxidation of said tantalum or titanium.

* * * * *